Figure 1:
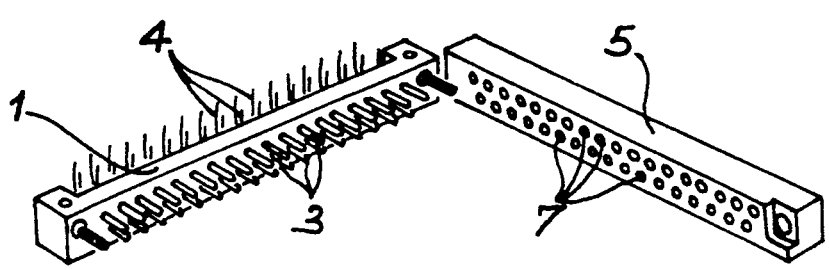

United States Patent [19]

Boissel et al.

[11] Patent Number: 5,350,323
[45] Date of Patent: Sep. 27, 1994

[54] CONTACT FOR AN ELECTRICAL CONNECTOR PROTECTED BY A POLYMER FILM AND ITS PRODUCTION PROCESS

[75] Inventors: Jacques Boissel, L'Isle-Adam, France; Joseph Delhalle, Noville-les-Bois, Belgium; Gérard LeCayon, Les Vlls; Pascal Viel, Meudon, both of France

[73] Assignees: Commissariat a l'Energie Atomique; Souriau et Cie, France

[21] Appl. No.: 71,380

[22] Filed: Jun. 3, 1993

Related U.S. Application Data

[63] Continuation of Ser. No. 830,691, Feb. 4, 1992, abandoned.

[30] Foreign Application Priority Data

Feb. 12, 1991 [FR] France .................... 91 01604

[51] Int. Cl.⁵ .............................................. H01R 4/58
[52] U.S. Cl. ........................... 439/886; 439/931; 428/929
[58] Field of Search ....................... 200/265–270; 428/626, 929, 334, 457, 458, 463; 439/519, 524, 884, 886, 887, 931

[56] References Cited

U.S. PATENT DOCUMENTS 4,687,274  8/1987  Suh et al. ........................ 439/886
5,011,733  4/1991  Hiraki et al. ..................... 428/463

FOREIGN PATENT DOCUMENTS 0038244  10/1981  European Pat. Off. .
0041381  12/1981  European Pat. Off. .
0053669   6/1982  European Pat. Off. .
0310668   4/1989  European Pat. Off. .
3834526   4/1990  Fed. Rep. of Germany .

OTHER PUBLICATIONS

ETZ Elektrotechnische Zeitschrift, vol. 111, No. 11, Jun., 1990, pp. 554–556, Berlin, DE; K. Giese: "Intrinsisch Elektrisch Leitenede Polymere Flachenstoffe".

*Primary Examiner*—Gary F. Paumen
*Attorney, Agent, or Firm*—Pearne, Gordon, McCoy & Granger

[57] ABSTRACT

The invention relates to a contact for an electrical contactor protected by a polymer film and to its production process.

This contact (3 or 7) has a contact resistance of at the most 10 ohms and incorporates a base metal coated by a 5 to 500 nm, homogeneous, adhesive organic polymer film. The polymer film can be deposited by the electropolymerization of a monomer such as acrylonitrile, followed by a heat treatment or irradiation to improve its electrical conductivity, so that a contact resistance not exceeding 10 ohms is obtained.

8 Claims, 5 Drawing Sheets

CONTACT FOR AN ELECTRICAL CONNECTOR PROTECTED BY A POLYMER FILM AND ITS PRODUCTION PROCESS

This is a continuation of application Ser. No. 07/830,691,filed Feb. 4, 1992, now abandoned.

DESCRIPTION

The present invention relates to a contact for an electrical connector usable in numerous fields such as data processing, aeronautics, telecommunications and devices implanted in the human body.

More specifically, it relates to the protection of contacts of such connectors against corrosion. In general, the contacts of electrical connectors are made from precious metals such as gold, which has the requisite qualities for obtaining a low electrical contact resistance, a good friction and a good corrosion behaviour. The gold is generally deposited on a nickel underlayer, which serves as a diffusion barrier. However, the cost of gold seriously increases prices.

Therefore research has been carried out with a view to replacing gold by other materials and use is sometimes made of tin-lead alloys or palladium-nickel alloys. However, these solutions are not completely satisfactory.

The present invention relates to an electrical connector using an original material for replacing the gold on the contacts.

According to the invention, the material used is a very thin organic polymer, which is normally electrically insulating but which, according to the invention, has been modified by an appropriate treatment to give it an adequate electrical conductivity to maintain the desired contact resistance value.

According to the invention, the electrical contact obtained has a contact resistance of at the most 10 ohms and incorporates a base metal coated with a 5 to 500 nanometer thick, homogeneous, adhesive organic polymer film. Preferably, the contact resistance is 5 to 20 milliohms.

Preferably, between the base metal of the contact and the polymer film is intercalated a metal underlayer with a thickness of 2 to 10 micrometers, usable metals being e.g. palladium, iron, cobalt and preferably nickel.

The bodies of the contacts of the connector are generally made from a cuprous base metal, e.g. copper, a copper alloy containing at least 50% copper, such as brass, bronze and cupronickel and slightly alloyed copper.

This base, e.g. of cuprous metal, can firstly be coated with a preferably ductile nickel underlayer, on which is deposited a very thin organic polymer film (5 to 500 nanometers thick) formed from an electrically insulating polymer, which is made sufficiently conductive by an appropriate treatment.

The organic polymers which can be used are those which can be transformed into polymers having a cyclic and/or unsaturated structure by a heat treatment or by irradiation. Examples of such polymers are polyacrylonitrile, polyvinyl pyrridine and polypentafluorostyrene.

Therefore the contacts for electrical connectors according to the invention are very advantageous, because they make it possible to avoid the use of expensive gold coatings by replacing them by ultra-thin organic polymer films, which ensure the desired protection, whilst also resisting friction of the contact surfaces.

The invention also relates to a process for protecting the surface of a contact for an electrical connector against corrosion and which comprises the following successive stages:

a) depositing on the surface a thin organic polymer film by electropolymerization and under cathodic polarization and b) subjecting polymer film to a heat treatment or an irradiation to give it an electrical conductivity such that the contact resistance of the electrical connector does not exceed 10 ohms.

Preferably, the process comprises a prior stage of depositing a 2 to 10 micrometer thick metallic underlayer, e.g. of nickel, on the surface of the contact.

Advantageously, the layer is deposited electrochemically, because this deposition method gives an underlayer with good properties, particularly in the case of nickel. Moreover, electrolytic deposition processes are widely used on an industrial scale.

In the first stage of the process according to the invention, either directly on the surface of the contact, or on an intermediate metallic underlayer, is deposited a thin film of organic polymer by electropolymerization under cathodic polarization, using the contact as the cathode. Generally use is made of a solution of the monomer, e.g. acrylonitrile, in an appropriate organic solvent, which does not dissolve the polymer formed and contains an electrolyte-support, e.g. a tetraalkyl ammonium perchlorate. The monomer concentration can vary within a wide range, e.g. from $10^{-1}$ to 10 mole/l. In certain cases, it is even possible to do without the organic solvent and use the pure monomer as the electrolyte-support solvent. The electrolyte-support concentration can also vary within a wide range, whilst remaining below that of the monomer. In order to carry out electropolymerization, to the cathode is applied an appropriate potential, which is in particular dependent on the monomer to be electropolymerized. In the case of acrylonitrile on nickel, the potential must be more negative than or equal to $-2.4$ V/Ag—Ag$^+$. An electropolymerization process usable in the invention is described more particularly in EP-A-38 244. In the first stage, the deposited polymer can in particular be polyacrylonitrile, polyvinyl pyrridine or polypentafluorostyrene.

In the second stage b) of the process, the polymer film deposited by electropolymerization is exposed to an appropriate treatment making it possible to increase its electrical conductivity without any deterioration in its protection properties against corrosion and friction resistance.

This treatment can consist of a heat treatment or an irradiation which makes it possible to modify the deposited thin polymer film in order to transform it into a derivative having a cyclized or unsaturated structure. The heat treatment can e.g. be carried out at 200° to 300° C. The irradiation treatment can be carried out by means of ultraviolet radiation, or by means of a white beam of synchrotron radiation.

In the case of heat treatments, the temperature and duration of the treatment are chosen as a function of the treated polymer in order to obtain the desired electrical conductivity.

In the case of irradiation treatments under ultraviolet rays, the latter can be carried out in air or an inert atmosphere, e.g. in argon and treatment conditions such as the duration and irradiation atmosphere are chosen as a function of the treated polymer so as to obtain the desired conductivity.

In the case of irradiation treatments by synchrotron white radiation, the duration of the treatment is also chosen as a function of the polymer used in order to obtain the desired result.

It is pointed out that the white beam of synchrotron radiation is the beam from a synchrotron prior to monochromatization. The latter comprises radiation identical to visible radiation enriched with soft X- and ultraviolet rays, whose wavelengths range between 2 and a few thousand Angstroms.

The invention is described in greater detail hereinafter relative to non-limitative embodiments and the attached drawings, wherein show:

FIG. 1 diagrammatically an electronic connector.

Figure 2:
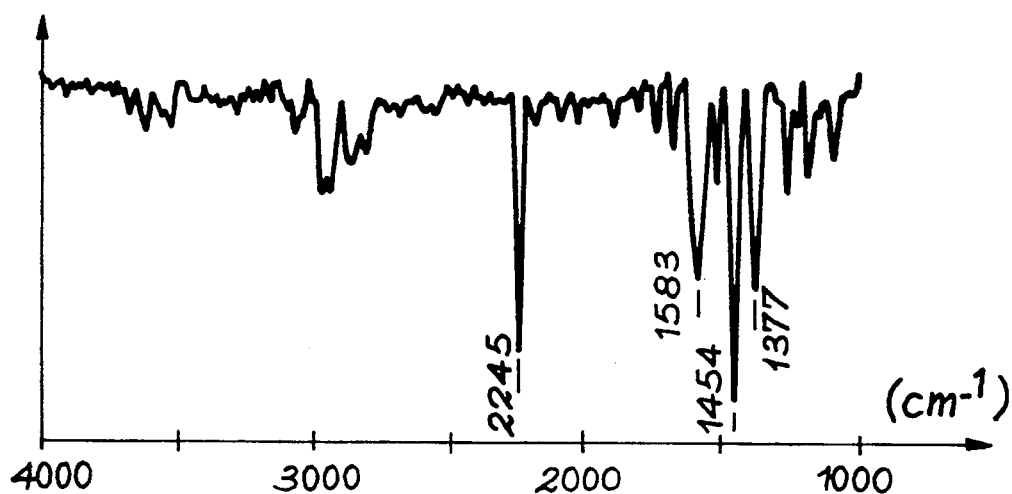
Figure 3:
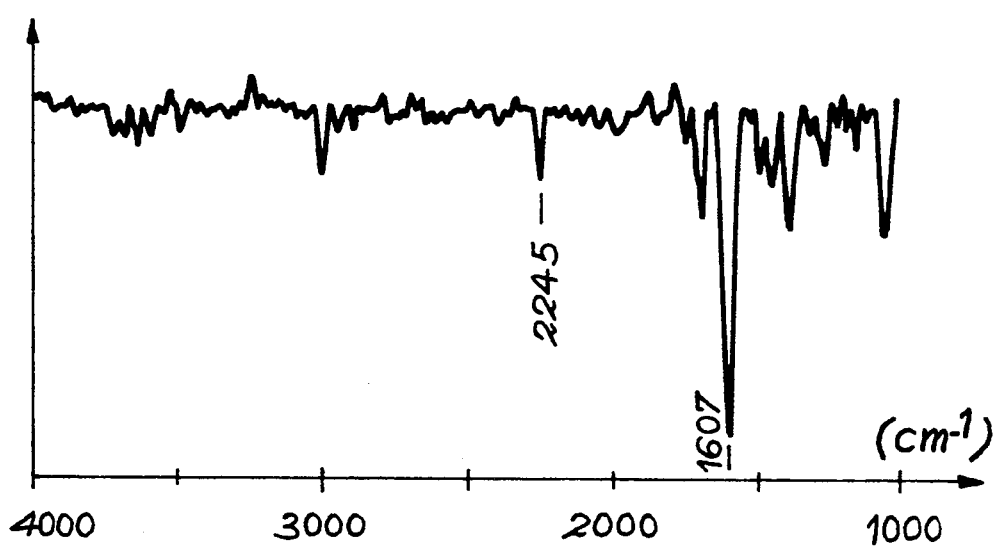

FIGS. 2 and 3 infrared spectra of polyacrylonitrile films treated at a temperature of 200° C. in air and for 2 hours (FIG. 2) and for 24 hours (FIG. 3).

Figure 4:
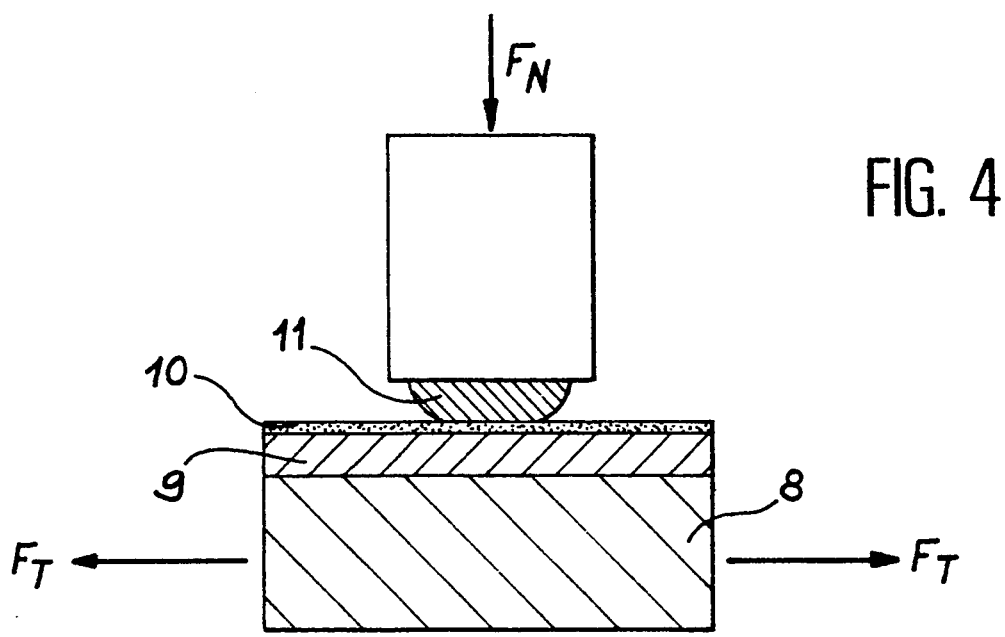

FIG. 4 the method for measuring the friction coefficient of the film of example 2.

Figure 6:
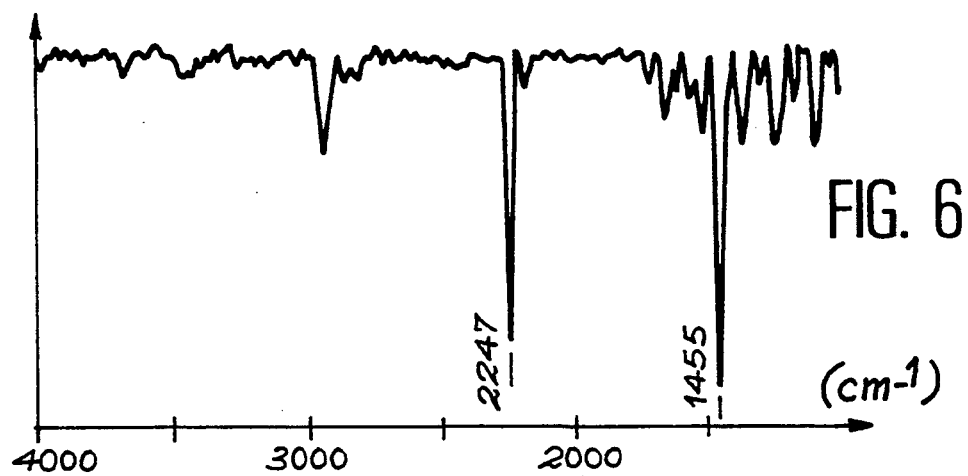
Figure 7:
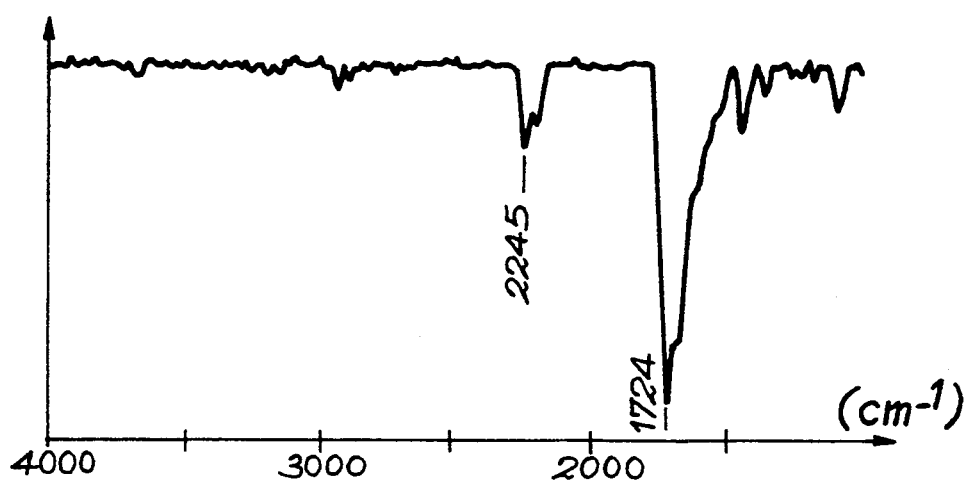
Figure 8:
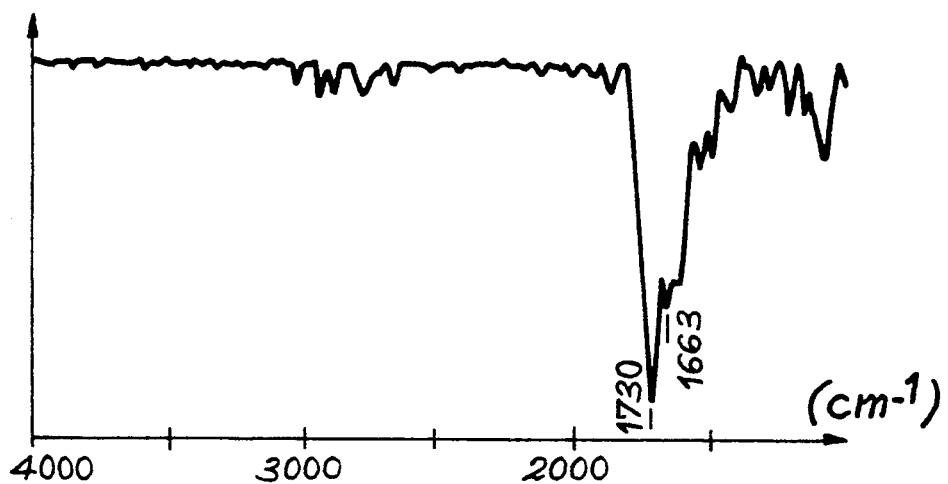

FIGS. 5 to 8 infrared spectra of polyacrylonitrile films exposed to an irradiation by means of ultraviolet rays for 2 (FIG. 5), 4 minutes (FIG. 6), 8 minutes (FIG. 7) and 16 minutes (FIG. 8).

Figure 9:
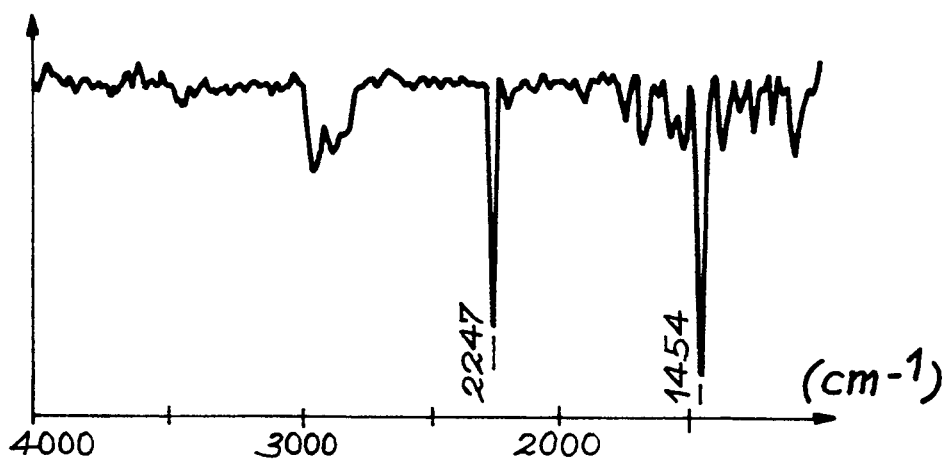
Figure 10:
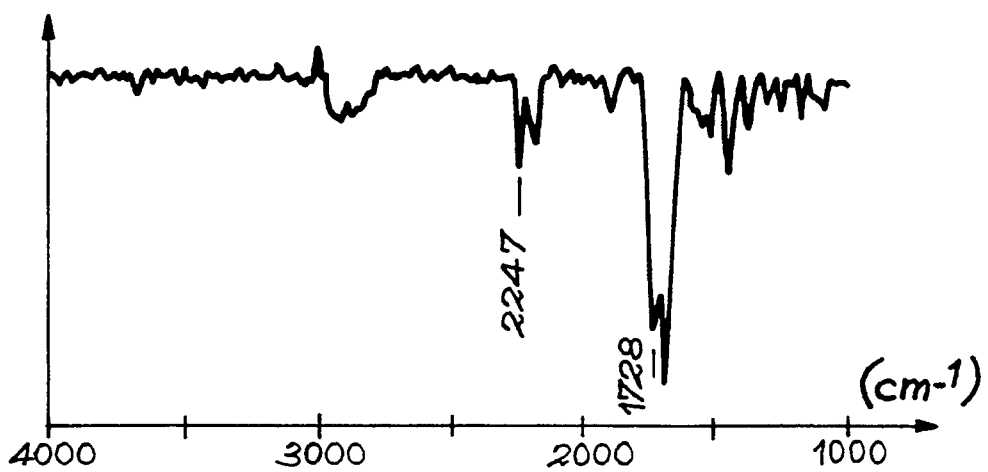
Figure 11:
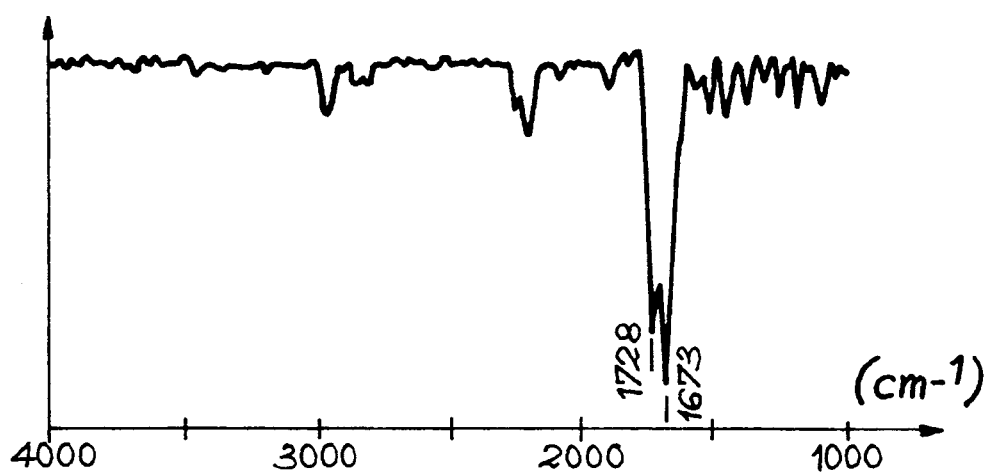

FIGS. 9 to 11 infrared spectra of polyacrylonitrile films irradiated by means of ultraviolet rays in argon for 2 minutes (FIG. 9), 8 minutes (FIG. 10) and 16 minutes (FIG. 11).

Figure 12:
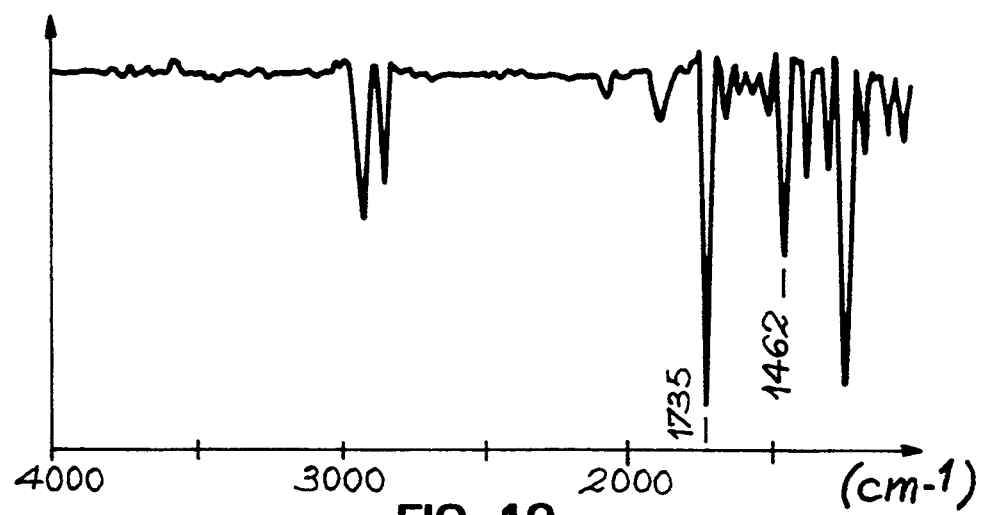

FIG. 12 an infrared spectrum illustrating the evolution of the structure of a polyacrylonitrile film, which has been treated by ultraviolet irradiation for 2 minutes and then kept in a saline mist atmosphere at 35° C. for 221 hours.

Figure 13:
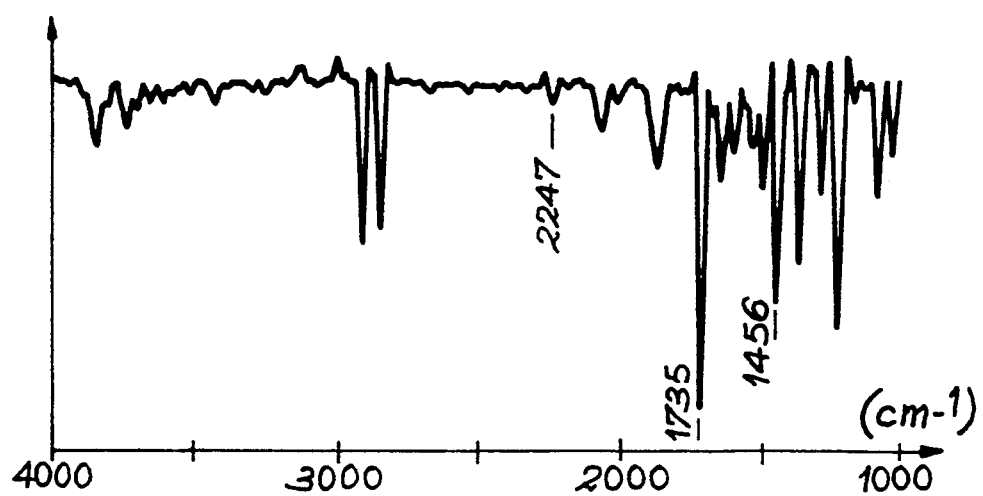

FIG. 13 the infrared spectrum of a polyacrylonitrile film, which has not undergone an irradiation treatment by ultraviolet rays, but which has been exposed for 221 hours at 35° C. to a saline mist, as in FIG. 12.

Figure 14:
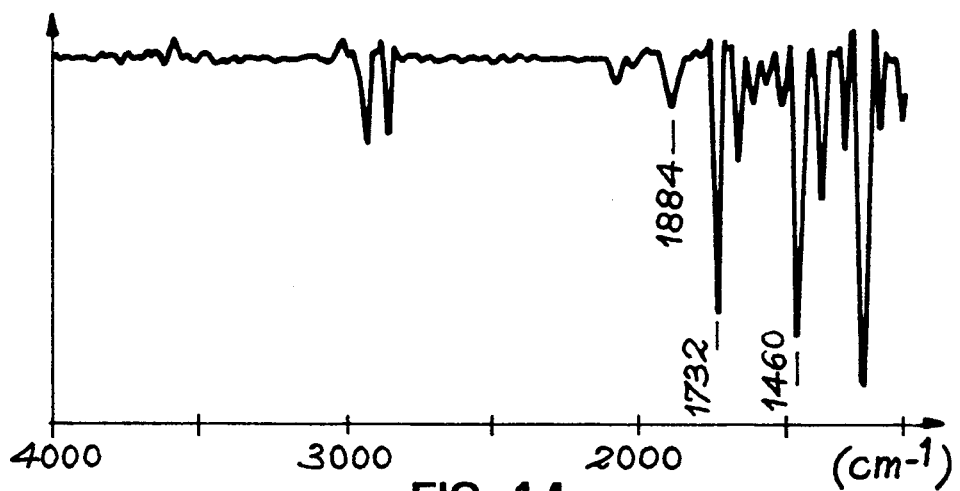

FIG. 14 the infrared spectrum of a polyacrylonitrile film, which has been irradiated by ultraviolet rays for 2 minutes, after spending 28 days at 40° C. in an atmosphere with 93% relative humidity.

Figure 15:
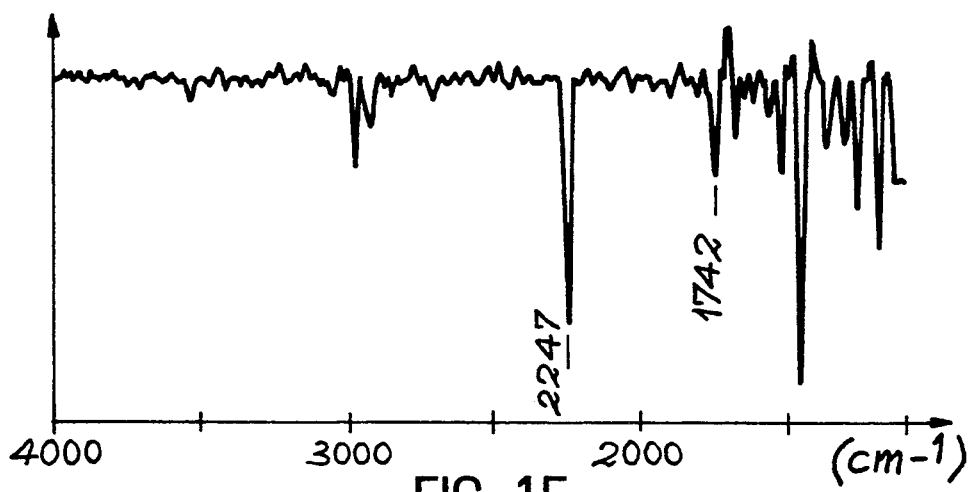

FIG. 15 the infrared spectrum of a polyacrylonitrile film, which has not undergone an irradiation treatment and after spending 28 days at 40° C. in a 93% relative humidity atmosphere, as in the case of the film of FIG. 14.

FIG. 1 diagrammatically shows an electronic connector in which the male member 1 is provided with several base metal, e.g. copper contacts 3 and connection points 4. This connector incorporates a female member 5, which also has several base metal, e.g. copper contacts 7. According to the invention, the surfaces of the contacts 3 and/or the surfaces of the contacts 7 are protected by a polymer film, which makes it possible to obtain a contact resistance of at the most 10 ohms.

EXAMPLE 1

This example illustrates the use of a protective coating having a nickel underlayer and a polyacrylonitrile film subject to heat treatment. In this example the contact surface to be coated is a brass surface, on which is firstly deposited by electrolysis a 2 $\mu$m thick nickel underlayer. Then, by electropolymerization on the nickel underlayer, is formed a 30 nm thick polyacrylonitrile film.

For the deposition of the film, the electrolytic solution is constituted by an acetonitrile solution containing 2.5 mole/liter of acrylonitrile, $5\times10^{-2}$ mole/liter of tetraethyl ammonium perchlorate and less than $5\times10^{-4}$ mole/liter of water.

In order to carry out the deposition of the film, the cathode is kept at a potential of approximately $-2.4$ V, relative to an Ag/Ag$^{30}$electrode for 2 seconds. This gives a 30 nanometer thick polyacrylonitrile film, which undergoes a heat treatment at 200° C., in air and for 2 hours.

FIG. 2 shows the infrared spectrum of the film obtained after this treatment. It is possible to see the formation and/or growth of peaks at 1670 cm$^{-1}$, 1377 cm$^{-1}$ and around 1600 cm$^{-1}$.

EXAMPLE 2

This example also illustrates a brass electronic connector protected by a heat treated polyacrylonitrile film. The same operating procedure as in Example 1 is followed for protecting the contact surface by a nickel underlayer and a polyacrylonitrile film, but the heat treatment is performed for 24 hours in air and at 200° C.

The infrared spectrum of the film obtained after this treatment is shown in FIG. 3. It is possible to see the vibration band of $CH_2$ at 1454 cm$^{-1}$ and the nitrile band at 2245 cm$^{-1}$, which have significantly decreased. The main absorption is now at 1600 cm$^{-1}$ and there is also a high absorption at 1700 cm$^{-1}$.

The properties of the thus treated film can be established by determining its friction coefficient, its structure by Auger imaging and its insulating behaviour. The friction coefficient is determined by using the sphere-plane method illustrated in FIG. 4. In the latter, the electrical contact surface 8 coated with the nickel underlayer 9 and the polymer film 10 is placed beneath a diameter 2.8 mm, rough, gold-plated, spherical ball 11, applied to the contact surface with a supporting force $F_N$ of 0.8N. The friction coefficient $\bar{\mu}$ is defined by the formula $$\bar{\mu}=F_T/F_N$$

in which $F_T$ is the tangential force necessary for displacing the contact surface by 1 mm at a speed of 0.1 mm/s, on applying the supporting force $F_N$. The friction coefficient is 0.14 and remains low and constant after 40 cycles.

Auger imaging reveals traces of deterioration on the film, but polymer still remains.

The contact resistance of the connector is a few ohms under a force of 80 gF (i.e. approximately 150 MPa) and is no more than 14 milliohms under a force of 120 gF (i.e. approximately 200 MPa). Thus, the treated film no longer has the behaviour of an electrical insulant.

EXAMPLE 3

This example illustrates the production of a polyacrylonitrile protection modified by irradiation by ultraviolet rays.

Figure 5:
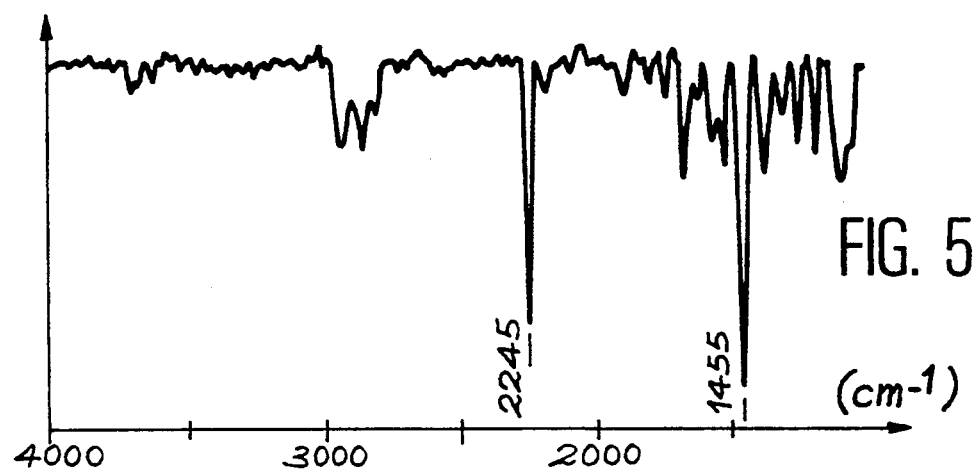

The same operating procedure as in Example 1 is used for coating a brass electrical contact with a nickel underlayer and a 30 nanometer thick polyacrylonitrile film. The film then undergoes an irradiation treatment by means of ultraviolet rays in air and for 2 minutes. FIG. 5 shows the infrared spectrum of the film obtained after this treatment.

EXAMPLE 4

This example uses the same operating procedure as in Example 3, but irradiation is carried out for 4 minutes. FIG. 6 shows the infrared spectrum of the film obtained under these conditions.

EXAMPLE 5

This example follows the same operating procedure as in Example 3, but irradiation is carried out for 8 minutes. FIG. 7 shows the infrared spectrum of the polyacrylonitrile film treated under these conditions.

EXAMPLE 6

This example adopts the same operating procedure as in Example 3, but irradiation is performed for 16 minutes. FIG. 8 shows the infrared spectrum of the film treated under these conditions.

By comparing the spectra of FIGS. 5 to 8, it can be seen that nitrile band at 2245 cm$^{-1}$ is suddenly reduced between 4 and 8 minutes treatment and that it disappears completely after 16 minutes. It is virtually the same for the band at 1455 cm. After 16 minutes there is essentially a doublet at 1690 cm and 1740 cm$^{-1}$, which could correspond to the appearance of the amide and ketone functions. There is also a weakening of the CH bands of the 290 cm$^{-1}$ region.

Thus, after treatment by UV irradiation in air and for 8 minutes, the oxidation of the film is exacerbated, unsaturations occur and there is a low cyclization level.

The electrical and mechanical properties of the film treated by UV irradiation in air and for 16 minutes are the friction coefficient is 0.26 and remains constant after 20 cycles. This value is average and slightly higher than that obtained by a heat treatment. The film does not tear. It is possible to detect the friction mark, but the film has a better resistance than in the case of heat treated films. The film does not have an insulating behaviour. The contact resistance Rc is only a few ohms under 80 gF.

EXAMPLE 7

This example follows the same operating procedure as in Example 1 for coating a brass electrical contact with a nickel underlayer and a 30 nanometer thick polyacrylonitrile film, but electropolymerization is carried out by maintaining the cathode at a potential of approximately $-2.4$ V compared with an Ag/Ag$^+$ electrode, while carrying out 10 25 ms sequences and the film then undergoes irradiation using ultraviolet rays, in an argon atmosphere and for 2 minutes. FIG. 9 shows the infrared spectrum of the film treated under these conditions.

EXAMPLE 8

The same operating procedure as in Example 7 is used, but irradiation is performed for 8 minutes. FIG. 10 shows the infrared spectrum of the film treated under these conditions.

EXAMPLE 9

The operating procedure of Example 7 is used, but the irradiation is performed for 16 minutes. FIG. 11 shows the infrared spectrum of the film treated under these conditions. On comparing FIGS. 9 to 11, it can be seen that the nitrile band at 2247 cm$^{-1}$ also decreases with the duration of the treatment, but does not completely disappear. The absorption around 2200 cm$^{-1}$ develops, whereas it disappeared when irradiation was carried out in air. The new absorption at 1683 cm$^{-1}$ and 1728 cm$^{-1}$ form a doublet close to the doublet observed during the irradiation in air, but with reversed relative intensities, the absorption at 1728 cm$^{-1}$ being weaker, whereas that in air is stronger.

Thus, when UV radiation takes place in argon, the structures corresponding to the higher oxidation degrees are weaker than when working in air. However, the unsaturations and cyclizations are greater than in air.

The attached table shows the final temperatures of the films treated in Examples 3 to 9.

EXAMPLE 10

This example checks the corrosion behaviour of polyacrylonitrile films treated by UV irradiation for 2 minutes and in argon obtained in accordance with Example 7. Comparison takes place with the polyacrylonitrile films obtained under the same conditions, but which have not undergone the irradiation treatment.

In this example, the contacts coated with the nickel underlayer and the polyacrylonitrile film in treated or untreated form are exposed to a temperature of 35° C. and for 221 hours in saline mist.

FIG. 12 shows the infrared spectrum of the treated polyacrylonitrile film following this exposure to mist. FIG. 13 shows the infrared spectrum of the untreated polyacrylonitrile film following said saline mist exposure.

A comparison of FIGS. 12 and 13 shows that the nitrile band at 2247 cm$^{-1}$ has completely disappeared in FIG. 12, but is also very weak in the infrared spectrum of FIG. 13. However, the other absorption bands are virtually identical for the two spectra. Thus, the UV irradiation treatment has not modified the protective power of the polyacrylonitrile film. Moreover, there is no corrosion of the nickel underlayer.

EXAMPLE 11

This example is used for testing the protection properties in moist heat of polyacrylonitrile films, in treated or untreated form, obtained in the same way as those used in example 10. In this example, the treated films are placed for 28 days in an oven at 40° C. and 93% relative humidity, i.e. close to saturation and the untreated films are placed for 17 days in an oven at 70° C. and 80% relative humidity.

FIG. 14 shows the infrared spectrum of the treated film after this stay in the oven. FIG. 15 shows the infrared spectrum of the untreated polyacrylonitrile film after being in the oven at 70° C.

A comparison of FIGS. 14 and 15 reveals that the nitrile peak at 2247 cm$^{-1}$ has completely disappeared in the treated film and that there has been a development of carbonyl structure (1732 cm$^{-1}$), cyclized structure (1663 cm$^{-1}$) and tertiary amines (1245 cm$^{-1}$) in the treated film. However, there is no corrosion of the base nickel.

TABLE

| Examples | UV Irradiation | Final temperature | Observations |
|---|---|---|---|
| Ex. 3 | 2 min/Air | 58° C. | |
| Ex. 4 | 4 min/Air | 85° C. | ½ regime |
| Ex. 5 | 8 min/Air | 104° C. | focal point |
| Ex. 6 | 16 min/Air | 130° C. | |
| Ex. 7 | 2 min/Argon | 55° C. | |
| Ex. 8 | 8 min/Argon | 70° C. | ½ regime |
| Ex. 9 | 16 min/Argon | 70° C. | focal point |

We claim:

1. A contact for an electrical connector having a contact resistance of at the most 10 ohms, incorporating a base metal covered with a 5 to 500 nanometer thick homogeneous, adhesive organic polymer film consisting according to only one polymer directly polymerized on the base metal, said polymer having a cyclized and unsaturated structure, wherein said cyclized and unsaturated structure is obtained by treatment of said polymer by one of heat or radiation, the radiation being selected from the group consisting of UV radiation and the white beam of synchroton radiation.

2. The contact according to claim 1, characterized in that the contact comprises a metal underlayer with a thickness of 2 to 10 micrometers between the base metal and the polymer film.

3. The contact according to claim 1, characterized in that the contact has a resistance of 5 to 20 milliohms.

4. The contact according to claim 1, characterized in that the base metal is copper or a copper alloy containing at least 50% copper.

5. The contact according to claim 2, characterized in that the underlayer is of nickel.

6. The contact according to claim 1, characterized in that the polymer derivative with the cyclized and unsaturated structure is a polyacrylonitrile derivative.

7. The contact according to claim 1, characterized in that the polymer derivative with a cyclized and unsaturated structure is a derivative of polyvinyl pyrridine or polypentafluorostyrene.

8. An electrical connector equipped with contacts according to claim 6.

* * * * *